(12) United States Patent
Tamura et al.

(10) Patent No.: US 6,299,942 B1
(45) Date of Patent: Oct. 9, 2001

(54) METHOD OF PRODUCING THE PLATED MOLDED ARTICLES BY NON-ELECTRODE PLATING, AND THE RESIN COMPOSITIONS FOR THAT USE

(75) Inventors: Eiji Tamura; Wataru Kosaka; Toshimi Arashi, all of Ichihara (JP)

(73) Assignee: Idemitsu Petrochemical Co., Ltd., Tokyo (JP)

( * ) Notice: Subject to any disclaimer, the term of this patent is extended or adjusted under 35 U.S.C. 154(b) by 0 days.

(21) Appl. No.: 09/510,674

(22) Filed: Feb. 22, 2000

(30) Foreign Application Priority Data

Feb. 22, 1999 (JP) .................................................. 11-042983

(51) Int. Cl.⁷ ................................. B05D 3/12; B05D 3/10
(52) U.S. Cl. ........................ 427/304; 427/348; 427/443.1
(58) Field of Search .................................. 427/384, 304, 427/348, 349, 443.1; 205/159

(56) References Cited

U.S. PATENT DOCUMENTS 5,134,190 * 7/1992 Kosaka .................................. 524/609
5,326,593 * 7/1994 Koizumi et al. ..................... 427/307

FOREIGN PATENT DOCUMENTS

99/16830 * 4/1999 (WO).

* cited by examiner

*Primary Examiner*—Erma Cameron
(74) *Attorney, Agent, or Firm*—Oblon, Spivak, McClelland, Maier & Neustadt, P.C.

(57) ABSTRACT

A process for producing an electrolessly plated molded article, which includes molding a resin composition made of a thermoplastic resin having a specific Izod impact strength and a Rockwell surface hardness and an inorganic filler, then treating the surface of the molded article with air blast using an abrasive having a sharp granular shape, and then conducting catalyst coating, activation treatment and electroless plating. It has been possible to apply the electroless plating with a high adhesion strength to the molded article of the thermoplastic resin composition without conducting the chemical etching treatment.

7 Claims, No Drawings

METHOD OF PRODUCING THE PLATED MOLDED ARTICLES BY NON-ELECTRODE PLATING, AND THE RESIN COMPOSITIONS FOR THAT USE

BACKGROUND OF THE INVENTION

1. Field of the Invention

The present invention relates to a process for producing an electrolessly plated molded article in which electroless plating is applied to a molded article of a thermoplastic resin composition made of a thermoplastic resin having a high hardness and an inorganic filler, and a polyarylene sulfide resin composition for the electrolessly plated molded article. More specifically, it relates to a process for producing an electrolessly plated molded article which dispenses with chemical etching treatment upon polishing the surface of the hard molded article by a specific blast method, and a polyarylene sulfide resin composition which can preferably be used in this process.

2. Description of the Related Art

The plating of plastics has been applied to engineering plastics such as nylons, polyacetals, modified PPE, polycarbonates, modified PPE/nylon and ABS/polycarbonate since it was developed concerning an ABS resin. The plating process, namely, an electroless plating process comprises steps of degreasing, etching, neutralization, catalyst coating, activation and electroless plating. Of these, especially the etching is an important step for roughening a surface of a molded article and securing a plate adhesion by an anchoring effect.

However, in the etching step and the neutralization step, a mixed acid of chromic acid and sulfuric acid is used as an etching agent in an ABS resin, and chemicals of strong acid and strong alkali are used in other resins. Accordingly, the measures taken to the safe environmental equipment and the quality control in the steps have been serious problems. For example, in case of a thermoplastic resin having a high hardness and a strong chemical resistance, such as a polyarylene sulfide, the usual etching is difficult, and an etching treatment in which glass fibers as the filler are raised on the surface through blast polishing and then eluted with hydrofluoric acid has been required.

Accordingly, a simple method that replaces the ordinary chemical etching treatment has been in demand.

The invention aims to provide a process for producing an electrolessly plated molded article in which electroless plating with a great adhesion strength can be applied to a molded article of a thermoplastic resin composition made of a thermoplastic resin having a high hardness and an inorganic filler without conducting chemical etching treatment, and a polyarylene sulfide resin composition for the electrolessly plated molded article.

SUMMARY OF THE INVENTION

The present inventors have assiduously conducted investigations to solve the problems, and have consequently found that in a molded article obtained by mixing a polyarylene sulfide with an inorganic filler, molding the mixture and polishing the molded article with granulated alumina, catalyst coating smoothly proceeds without conducting etching treatment, which results in providing an electrolessly plated molded article having a strong adhesion strength. This finding has led to the completion of the invention. The summary of the invention is as follows.

(1) A process for producing an electrolessly plated molded article, which comprises molding a resin composition made of
  (A) 100 parts by weight of a thermoplastic resin having the following properties (a1) and (a2)
    (a1) an Izod impact strength of 35 J/m or less, and
    (a2) a surface hardness of R115 or more in terms of a Rockwell surface hardness, and
  (B) 100 parts by weight or more of an inorganic filler, then treating the surface of the molded article with blast to make a surface roughness Rmax 15 μm or more, and thereafter conducting catalyst coating, activation treatment and electroless plating.

(2) The process for producing the electrolessly plated molded article as recited in (1), wherein the treatment with blast is conducted by treatment with air blast using an abrasive having a sharp granular shape.

(3) A process for producing an electrolessly plated molded article, which comprises molding a resin composition made of
  (A) 100 parts by weight of a thermoplastic resin having the following properties (a1) and (a2)
    (a1) an Izod impact strength of 35 J/m or less, and
    (a2) a surface hardness of R115 or more in terms of a Rockwell surface hardness, and
  (B) 100 parts by weight or more of an inorganic filler, then treating the surface of the molded article with air blast using an abrasive having a sharp granular shape, and thereafter conducting catalyst coating, activation treatment and electroless plating.

(4) The process for producing the electrolessly plated molded article as recited in (2) or (3), wherein the abrasive having the sharp granular shape is granulated alumina.

(5) The process for producing the electrolessly plated molded article as recited in any one of (1) to (4), wherein the thermoplastic resin is a polyarylene sulfide or a syndiotactic polystyrene.

(6) The process for producing the electrolessly plated molded article as recited in any one of (1) to (5), wherein at least a part of the inorganic filler is a whisker.

(7) The process for producing the electrolessly plated molded article as recited in (6), wherein the whisker is one type or a combination of two or more types selected from a zinc oxide whisker, an aluminum borate whisker and a calcium silicate whisker.

(8) A polyarylene sulfide resin composition for an electrolessly plated molded article which composition is made of
  (A') 20 to 50% by weight of a polyarylene sulfide having a melt viscosity of 100 Pa·sec or less,
  (B') 5 to 50% by weight of a zinc oxide whisker,
  (C') 0 to 75% by weight of a ground inorganic filler, and
  (D') 0 to 50% by weight of a fiber reinforcement.

(9) The polyarylene sulfide resin composition for the electrolessly plated molded article as recited in (8), wherein the ground inorganic filler is one type or a combination of two or more types selected from aluminum nitride, magnesium oxide, alumina and graphite.

DESCRIPTION OF THE PREFERRED EMBODIMENTS

The preferred embodiments of the invention are described below.

Thermoplastic resin having a high hardness

The thermoplastic resin used in the invention has a high hardness, and its properties are as follows.

(a1) an Izod impact strength of 35 J/m or less, preferably 7 to 30 J/m, and (a2) a surface hardness of R115 or more, preferably R120 to R128 in terms of a Rockwell surface hardness.

With respect to the Izod impact strength, a notched strength at room temperature is measured according to ASTM D 256, using an injection-molded piece having a size of 64×12.7×3.2 mm. Further, the Rockwell surface hardness is measured at room temperature (23° C., 50%±5% RH) according to ASTM D785, using an injection-molded piece having a size of 80×80×7 mm with an R scale [as an indenter, a steel ball having a diameter of 12.7±0.0025 is used, the indenter is put on a surface of a test piece under a test load of 60 kg (provided a standard load is 10 kg), and a return distortion amount of the test piece including the indenter is measured].

The thermoplastic resin used in the invention is such a hard resin. When the Izod impact strength exceeds 3.5 J/m or the surface hardness is less than R115 in terms of the Rockwell surface hardness, the uneven shape of the surface on the molded article by which to exhibit the anchoring effect is hardly provided.

Further, the resin of the invention is a thermoplastic resin, namely a resin having such qualities that it is softened by heating to become plastic and is hardened again by cooling. It is contrasted with a thermosetting resin. Specific examples thereof include linear polymers formed by an addition polymerization reaction, such as polyethylene, polystyrene and polyvinyl chloride, and polycondensates of difunctional monomers, such as polyesters and nylons. Of these, specific examples of the thermoplastic resin having the properties (a1) and (a2) include a polyarylene sulfide, a syndiotactic polystyrene, nylon 66, nylon 6, polyethylene terephthalate, polybutylene terephthalate, an acrylic resin and an acrylic-styrene resin. These can be used either singly or in combination. Of these, a polyarylene sulfide and a syndiotactic polystyrene are especially preferable.

Polyarylene sulfide

The polyarylene sulfide used in the invention is a polymer containing 70 mol % or more of a recurring unit represented by a structural formula [—Ar—S—] wherein Ar is an arylene group and S is sulfur. Its typical example is a polyarylene sulfide containing 70 mol % or more of a recurring unit represented by the following structural formula (I)

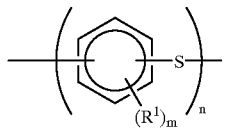

(I)

wherein

R$^1$ is a substituent selected from an alkyl group having 6 or less carbon atoms, an alkoxy group, a phenyl group, a carboxylic acid or its metal salt, an amino group, a nitro group and halogen atoms such as fluorine, chlorine and bromine, m is an integer of 0 to 4, and n is an average degree of polymerization in the range of 10 to 300.

When the recurring unit is less than 70 mol %, an amount of an inherent crystalline component characteristic of a crystalline polymer is reduced, and a mechanical strength is sometimes unsatisfactory.

Further, a homopolymer and a copolymer are also available.

Examples of the copolymer structural unit include an m-phenylene sulfide unit, an o-phenylene sulfide unit, a p,p'-diphenyleneketone sulfide unit, a p,p'-diphenylenesulfone sulfide unit, a p,p'-biphenylene sulfide unit, a p,p'-diphenylenemethylene sulfide unit, a p,p'-diphenylenecumenyl sulfide unit and a naphthyl sulfide unit.

Further, the molecular structure may be a linear structure, a branched structure or a crosslinked structure. A linear structure is preferable.

That is, as the polyarylene sulfide of the invention, besides a polymer having a substantially linear structure, a polymer having a branched structure which is obtained by the polymerization using a small amount of a monomer having three or more functional groups as part of monomers or a crosslinked structure can also be used. Further, it may be used by being blended with the polymer having the substantially linear structure.

Moreover, as the polyarylene sulfide used in the invention, a polymer obtained by increasing a melt viscosity of a polymer of a linear structure having a relatively low molecular weight through oxidative crosslinking or heat crosslinking to improve a moldability is also available.

The polyarylene sulfide used in the invention can be produced by a known method. For example, it can be obtained by polycondensing a dihalo aromatic compound with a sulfur source in an organic polar solvent, and washing and drying the polycondensate.

In addition, in the polyarylene sulfide used in the invention, a melt viscosity at a resin temperature of 300° C. and a shear rate of 200 sec$^{-1}$ is 100 Pa·sec or less, preferably between 10 and 90 Pa·sec, more preferably between 20 and 60 Pa·sec. When the melt viscosity exceeds 100 Pa·sec, an amount of an inorganic filler required to form an uneven shape of a surface on a molded article by which to exhibit an anchoring effect is reduced, and a plate peeling strength is decreased.

The melt viscosity (Pa·sec) is measured under conditions that a resin temperature is 300° C. and a shear rate is 200 sec$^{-1}$ using Capillograph (manufactured by Toyo Seiki K.K.).

Syndiotactic polystyrene

In the invention, the syndiotactic polystyrene mainly refers to a styrenic polymer having a syndiotactic polystyrene structure. The syndiotactic structure here referred to is a stereostructure in which phenyl groups as side chains are alternately positioned in the opposite direction relative to a main chain made of a carbon-carbon bond. The tacticity is measured by the nuclear magnetic resonance method ($^{13}$C-NMR) with isotopic carbon. The tacticity measured by the $^{13}$C-NMR method can be expressed by the ratio of plural continuous structural units. For example, when the number of structural units is 2, the tacticity is expressed by diad. When the number of structural units is 3, it is expressed by triad. When the number of structural units is 5, it is expressed by pentad. The styrenic polymer mainly having the syndiotactic structure, referred to in the invention, is a polymer having at least 75%, preferably at least 85% of a syndiotacticity in racemidiad, or at least 30%, preferably at least 50% of a syndiotacticity in racemipentad. Examples thereof include polystyrene, a poly(alkylstyrene), a poly(halostyrene), a poly(haloalkylstyrene), a poly(alkoxystyrene), poly(vinyl benzoate), hydrogenated substances thereof, mixtures thereof and copolymers containing the same as a main component. Examples of the poly(alkylstyrene) include poly(methylstyrene), poly(ethylstyrene), poly(isopropylstyrene), poly(tert-butylstyrene), poly(phenylstyrene), poly(vinylnaphthalene)

and poly(vinylstyrene). Examples of the poly(halostyrene) include poly(chlorostyrene), poly(bromostyrene) and poly(fluorostyrene). Examples of the poly(haloalkylstyrene) include poly(chloromethylstyrene). Examples of the poly(alkoxystyrene) include poly(methoxystyrene) and poly(ethoxystyrene).

Of these, especially preferable examples of the styrenic polymers include polystyrene, poly(p-methylstyrene), poly(m-methylstyrene), poly(p-tert-butylstyrene), poly(p-chlorostyrene), poly(m-chlorostyrene), poly(p-fluorostyrene), hydrogenated polystyrene and copolymers containing the structural units thereof.

The styrenic polymer mainly having the syndiotactic structure can be produced by a known method. For example, a method is mentioned in which a styrenic monomer (monomer corresponding to the styrenic polymer) is polymerized in an inert hydrocarbon solvent or in the absence of a solvent using a condensate of a titanium compound, water and a trialkyl aluminum as a catalyst (Japanese Patent Laid-Open No. 187708/1987). Further, the poly(haloalkylstyrene) and the hydrogenated substance thereof can also be obtained by a known method described in, for example, Japanese Patent Laid-Open Nos. 46912/1989 and 178505/1989.

The molecular weight is not particularly limited. The weight average molecular weight is at least 10,000, preferably at least 50,000. Further, the molecular weight distribution is not particularly limited either, and various molecular weight distributions are available. When the weight average molecular weight is less than 10,000, thermal and mechanical properties of the resulting composition or molded article are decreased. Thus, it is undesirable.

These styrenic polymers having the syndiotactic structure can be used either singly or in combination.

Inorganic filler

The type of the inorganic filler used in the resin composition of the invention is not particularly limited. It includes so-called ground inorganic fillers such as particulate, granular and flaky inorganic fillers, and so-called fibrous inorganic fillers such as a whisker, an inorganic fiber and a metallic fiber. Specific examples of the ground inorganic fillers include calcium carbonate, calcium sulfate, calcium phosphate, magnesium carbonate, magnesium oxide, magnesium phosphate, talc, mica, silica, alumina, silica alumina, kaolin, bentonite, montmorillonite, clay, graphite, carbon black, glass beads, titanium oxide, zirconium oxide, silicon nitride, hydrotalcite and aluminum hydroxide. Further, specific examples of the fibrous inorganic fillers include a glass fiber, a carbon fiber, a calcium titanate whisker, an aluminum borate whisker, a calcium carbonate whisker, a calcium silicate whisker (wollastonite), a calcium sulfate whisker (zonolite), a silicon carbide whisker, a silicon nitride whisker, a zinc oxide whisker, an alumina whisker and a graphite whisker.

Of these, the whisker is especially preferable. As the inorganic filler constituting the resin composition of the invention, it is preferable that at least a part thereof is a whisker and the remainder is the other inorganic filler.

The whisker allows the formation of the surface structure appropriate for the catalyst coating by the treatment with blast in the electroless plating step of the invention. Accordingly, a plated molded article excellent in an adhesion strength in particular can be provided.

As the whisker, a zinc oxide whisker, an aluminum borate whisker and a calcium silicate whisker which are used either singly or in combination are preferable. More preferable is a zinc oxide whisker.

Resin composition made of a thermoplastic resin having a high hardness and an inorganic filler The electrolessly plated molded article of the invention is formed of a resin composition made of 100 parts by weight of the thermoplastic resin having the high hardness and 100 parts by weight or more, preferably 100 to 400 parts by weight of the inorganic filler.

That is, when the inorganic filler is less than 100 parts by weight, the uneven shape of the surface on the molded article by which to exhibit the anchoring effect is hardly provided, and the plate adhesion strength is decreased.

In the invention, the electroless plating of the invention is applied to the molded article formed of the resin composition having the high surface hardness. The electrolessly plated molded article of the invention is the molded article containing such a hard resin and the inorganic filler, so that the electroless plating treatment to be described later acts effectively.

Polyarylene sulfide resin composition

The most preferable resin composition for the electrolessly plated molded article in the invention is a polyarylene sulfide resin composition made of (A') 20 to 50% by weight, preferably 20 to 40% by weight of a polyarylene sulfide having a melt viscosity of 100 Pa·sec or less, preferably 20 to 60 Pa·sec, (B') 5 to 50% by weight, preferably 10 to 30% by weight of a zinc oxide whisker, (C') 0 to 75% by weight, preferably 10 to 50% by weight of a ground inorganic filler, preferably one type or a combination of two or more types selected from aluminum nitride, magnesium oxide, alumina and graphite, and (D') 0 to 50% by weight, preferably 20 to 40% by weight of a fiber reinforcement.

The polyarylene sulfide and the zinc oxide whisker among the molding components are the same as described above.

Ground inorganic filler

The ground inorganic filler used in the polyarylene sulfide resin composition for the electrolessly plated molded article of the invention may be added as required in view of the adjustment of the specific gravity of the molded article and the problem on the end of the molded article in which the fibrous filler is not incorporated. Examples thereof include aluminum nitride, magnesium oxide, alumina, graphite, calcium carbonate, calcium sulfate, calcium phosphate, magnesium carbonate, magnesium oxide, magnesium phosphate and glass beads. Of these, aluminum nitride, magnesium oxide, alumina and graphite which are excellent in the heat dissipation can effectively be used to improve the plate adhesion strength in the heat cycle of the plated article.

Fiber reinforcement

The fiber reinforcement used in the polyarylene sulfide resin composition for the electrolessly plated molded article of the invention is a fiber reinforcement except a whisker. Examples thereof include inorganic fibers such as a carbon fiber, asbestos, a glass robing, a glass chopped strand and a glass long fiber mat, and metallic fibers such as a copper fiber, a titanium fiber, an aluminum fiber and an iron fiber.

Formulation

When the amount of the polyarylene sulfide as component (A') is less than 20% by weight, the fluidity is notably decreased. When it exceeds 50% by weight, the uneven shape of the surface on the molded article by which to exhibit the anchoring effect is hardly provided, and the plate adhesion strength is decreased. Further, when the amount of the zinc oxide whisker as component (B') is less than 5% by weight, the plate adhesion strength is decreased. When it exceeds 50% by weight, the fluidity is notably decreased. Still further, when the amount of the ground inorganic filler as component (C') exceeds 75% by weight, the fluidity is notably decreased. When the amount of the fiber reinforcement as component (D') exceeds 50% by weight, the fluidity is notably decreased.

The polyarylene sulfide resin composition for the electrolessly plated molded article of the invention may contain, in addition to the foregoing components, the other components as required unless the effects of the invention are impaired. Examples of the other components include additives such as an antioxidant, a weathering agent, a lubricant, a plasticizer, an antioxidant and a colorant, thermoplastic resins and/or thermosetting resins such as a polyamide, an epoxy resin, a silicone resin, silicone oil, a polyolefin, a polyether sulfone and a polyphenylene ether, rubbers such as hydrogenated SBS, hydrogenated NBR, silicone rubber and fluororubber, and a pigment.

The polyarylene sulfide resin composition of the invention can be obtained by mixing components (A'), (B'), (C') and (D') with the additives as required, and melt-kneading the mixture with a Henschel mixer and a twin-screw extruder usually at 280 to 350° C.

Process for producing an electrolessly plated molded article

A process for producing an electrolessly plated molded article in the invention comprises forming the molded article, then treating the molded article with blast to make the surface roughness Rmax approximately 15 $\mu$m or more, and thereafter conducting catalyst coating, activation treatment and electroless plating.

That is, it is a process for producing an electrolessly plated molded article which process dispenses with the chemical etching step that has been so far inevitable by the treatment with blast.

The steps in the production of the electrolessly plated molded article in the invention are described in detail below. First, it is required that the surface of the molded article is polished by treating the molded article with air blast using an abrasive having a sharp granular shape until the surface roughness Rmax reaches approximately 15 $\mu$m or more. The abrasive having the sharp granular shape is not particularly limited so long as it is a general abrasive having a blocky or sharp granular shape. Further, the granular shape of many abrasives is known to depend on the granulating conditions of the granulating step in the production stage. Accordingly, it can usually be selected from crude granules obtained from molten alumina, burnt alumina, silica rock and a molten mixture of chromium oxide and burnt alumina which have been ordinarily used for air blast treatment of processed products of plastics, brass, aluminum and zinc diecast. Of these, granulated alumina can preferably be used. It is thus inevitable to use the abrasive having the sharp granular shape. When beads of glass or metals having a round corner in contrast with this is used as an abrasive, no satisfactory effect is provided.

The molded article thus treated with air blast satisfactorily exhibits the same effect as that given by the chemical etching, and then subjected to the catalyst coating step.

The steps of from the catalyst coating to the electroless plating are conducted by methods known so far. For example, in the catalyst coating step, a molded article to be treated is dipped in a colloidal solution containing tin ions and palladium ions at room temperature for 2 to 5 minutes. Subsequently, the tin layer coated on the surface of palladium is removed, and the activation treatment is conducted for exhibiting the function of the palladium catalyst. Specifically, the molded article is treated with a strong acid such as sulfuric acid or hydrochloric acid. The catalyst here functions to adsorb nickel or copper metal precipitated, and this function enables the plating. In case of the nickel plating, an electroless plating bath (pH 9.0 to 9.5, 25 to 35° C.) comprising 30 g/liter of nickel sulfate as a metal salt, 40 g/liter of sodium citrate as a complexing agent, 20 g/liter of sodium phosphite as a reducing agent and 25 ml/liter of ammonia as a pH adjustor is ordinarily used. When the molded article to be treated is dipped in this electroless plating bath, metallic ions reduced with the reducing agent are precipitated on the surface as metals. This electroless plating treatment usually provides a plate having a thickness of 0.2 to 0.5 $\mu$m in 5 to 10 minutes.

The process for producing the electrolessly plated molded article in the invention is characterized by the specific treatment with blast which dispenses with the chemical etching that has been so far an indispensable step. Especially when a molding material made of a polyarylene sulfide and an inorganic filler is used, deburring that occurs in the molding is indispensable. Accordingly, it is quite advantageous that the deburring can be conducted in the extended stage of the treatment with blast.

The invention is illustrated more specifically with reference to Examples.

The test methods used in Examples are as follows.

(1) Measurement of a surface roughness

Rmax was measured according to JIS B 0601 using a surface roughness measuring unit (Surf Coder SE-307 manufactured by Kosaka Kenkyusho).

(2) Evaluation of an adhesion strength of a plated film (peeling strength at room temperature)

Parallel cuts having a width of 10 mm were applied to the plated surface of the plated sample, and one end was peeled off from the substrate by approximately 20 mm. The peeled portion was installed on a tensile tester, and the tester was actuated at a rate of 25 mm/min such that the plate was uniformly peeled off to obtain a peeling strength (kgf/cm).

When the plate was not deposited, it was expressed by x. When the adhesion strength was less than 1.0 kgf/cm, the plate was of no practical use as a plated film.

(3) Evaluation of an adhesion strength (peeling strength) in a heat shock test of a plated film A heat cycle tester manufactured by Tabai Espec was used. A heat cycle condition was that one cycle was −30° C. (1 hour), 20° C. (1 hour), 80° C. (1 hour) and 20° C. (1 hour) and this cycle was repeated 200 times. The resulting plated sample was measured for the peeling strength in the same manner as in (2). When a plate was not deposited, it was expressed by x. When the adhesion strength was 0.3 kgf/cm or less, the peeling of the plated film was sometimes observed.

Further, the components used in Examples are as follows.

(a) Resin

PPS: polyphenylene sulfide

IPC-1 (made by Idemitsu Petrochemical Co., Ltd.), melt viscosity (300° C., 200 sec$^{-1}$) 30 Pa·sec, Izod impact strength 12 J/m, Rockwell hardness R120

IPC-3 (made by Idemitsu Petrochemical Co., Ltd.), melt viscosity (300° C., 200 sec$^{-1}$) 90 Pa·sec, Izod impact strength 18 J/m, Rockwell hardness R120

IPC-6 (made by Idemitsu Petrochemical Co., Ltd.), melt viscosity (300° C., 200 sec$^{-1}$) 500 Pa·sec, Izod impact strength 40 J/m, Rockwell hardness R120

SPS: syndiotactic polystyrene

130 Z (made by Idemitsu Petrochemical Co., Ltd.), Izod impact strength 15 J/m, Rockwell hardness R116

PA66: nylon 66
Leona 1200S (made by Asahi Chemical Industry Co., Ltd.), Izod impact strength 34 J/m, Rockwell hardness R120

(b) Whisker

Potassium titanate: Tismo D101 (made by Otsuka Kagaku K.K.)
Zinc oxide: Panatetra 0511 (made by Matsushita Amtec)
Aluminum borate: Alborex YS2A (made by Shikoku Kasei Kogyo)
Calcium silicate: NYGLOS (made by Nyco)

(c) Ground inorganic filler $CaCO_3$: Whiton P-30 (made by Shiraishi Kogyo K.K.)
$Al_2O_3$: AL-43 PC (made by Showa Denko K.K.)
MgO: Pyrokisma 3320 (made by Kyowa Kagaku Kogyo K.K.)

(d) Fiber reinforcement

GF (glass fiber): 03JAFT591 (made by Asahi Fiber Glass Co., Ltd.)

EXAMPLE 1

A flat plate having a size of 80×80×3.2 mm was obtained by injection molding with an injection-molding machine (J50E-P manufactured by The Japan Steel Works, Ltd.) using a molding material comprising (a) 50% by weight of polyphenylene sulfide [IPC-3 made by Idemitsu Petrochemical Co., Ltd., melt viscosity (300° C., 200 $sec^{-1}$) 90 Pa·sec, Izod impact strength 18 J/m, Rockwell hardness R120], (b) no whisker, (c) no ground inorganic filler and (d) 50% by weight of a glass fiber as a fiber reinforcement according to the formulation shown in Table 1. For applying the electroless copper plating to this molded article, the molded article was first treated with blast. The polishing treatment with blast was conducted with Ascon Blast Cabinet B-O model manufactured by Atsuji Tekko K.K. as a blast treatment device using glass beads ("GB" for short) (J-70 manufactured by Toshiba-Ballotini Co., Ltd., particle diameter 350 to 180 μm), stainless beads (SB for short) (CHRONITAL No. 30 manufactured by Keetel, particle diameter 140 to 150 μm) and alumina ("WA" for short) (NISSORUNDUM 50A WA #150 manufactured by Taiheiyo Random K.K.) as an abrasive respectively. The treatment with blast was conducted at a blast pressure of 3 kg/$cm^2$ upon setting a distance between an end of a jet nozzle and a flat plate of a molded article at approximately 5 cm. Then, the surface roughness Rmax was 18 μm.

Thereafter, the molded article subjected to the treatment with blast was dipped in a colloidal solution containing tin ions and palladium ions at room temperature for approximately 3 minutes. Then, in order to remove the tin layer coated on the surface of palladium, the activation treatment for exhibiting the function of the palladium catalyst was conducted using hydrochloric acid. The molded article subjected to the activation treatment was dipped in the electroless copper plating bath.

The electroless copper plating bath was made of 10 g/liter of copper sulfate as a metal salt, 50 g/liter of Rochelle salt as a complexing agent, 10 ml/liter of formalin as a reducing agent and 10 g/liter of sodium hydroxide as a pH adjustor. The treatment was conducted with a pH of 12 at a temperature of 25° C. for a dipping time of 8 minutes. The plated film thickness of the resulting electrolessly plated molded article was approximately 1 μm on average.

Further, for applying the electroplating to the molded article, it was placed in an electrolyte of copper sulfate as an electrode plate, and a current having a low current density of approximately 0.5 A/$cm^2$ was passed to conduct strike plating with a plated film thickness of approximately 3 μm. The resulting plated molded article was then washed with water. Subsequently, copper plating, water-washing, nickel substrate plating and water-washing were repeated again. The plate of the uppermost layer was washed with water, and finished by drying. The copper plating was applied to the uppermost layer, and the thickness of the final plated film was approximately 25 μm.

The samples in which three types of abrasives were used respectively were evaluated with respect to the adhesion of the plated film at room temperature and the adhesion in the heat cycle. The results of the evaluations are shown in Table 2.

EXAMPLES 2 TO 10 AND COMPARATIVE EXAMPLES 1 TO 4

According to the formulation shown in Table 1, a molding material was prepared as in Example 1, and molded into a flat plate. Then, the flat plate was subjected to the electroless copper plating and the final copper electroplating.

The samples in which three types of abrasives were used respectively were evaluated with respect to the adhesion of the plated film at room temperature and the adhesion in the heat cycle. The results of the evaluations are shown in Table 2.

TABLE 1

| | PPS | | | | Calcium titanate whisker | Zinc oxide whisker | Aluminum borate whisker | Calcium silicate whisker | Ground filler | | | |
|---|---|---|---|---|---|---|---|---|---|---|---|---|
| | IPC-1 | IPC-3 | IPC-6 | SPS | PA66 | | | | | $CaCO_3$ | $Al_2O_3$ | MgO | GF |
| Example 1 | | 50 | | | | | | | | | | | 50 |
| Example 2 | 30 | | | | | | | | | 40 | | | 30 |
| Example 3 | 30 | | | | | 15 | | | | 25 | | | 30 |
| Example 4 | 30 | | | | | | 15 | | | 25 | | | 30 |
| Example 5 | 30 | | | | | | | 15 | | 25 | | | 30 |
| Example 6 | 30 | | | | | | | | 15 | 25 | | | 30 |
| Example 7 | 40 | | | | | 50 | | | | 10 | | | |
| Example 8 | | | | 50 | | | | | | | | | 50 |
| Example 9 | 30 | | | | | 20 | | | | 10 | 40 | | |
| Example 10 | 30 | | | | | 10 | | | | | | 40 | 20 |
| Example 11 | | | 30 | | | | | | | 40 | | | 30 |
| Comparative Example 1 | | 70 | | | | | | | | | | | 30 |

TABLE 1-continued

| | PPS | | | SPS | PA66 | Calcium titanate whisker | Zinc oxide whisker | Aluminum borate whisker | Calcium silicate whisker | Ground filler | | | |
|---|---|---|---|---|---|---|---|---|---|---|---|---|---|
| | IPC-1 | IPC-3 | IPC-6 | | | | | | | CaCO$_3$ | Al$_2$O$_3$ | MgO | GF |
| Comparative Example 2 | | 100 | | | | | | | | | | | |
| Comparative Example 3 | | 100 | | | | | | | | | | | |
| Comparative Example 4 | | 60 | | | | | | | | | | | 40 |

(unit: wt.%)

TABLE 2

(unit: kgf/cm)

| | Plate adhesion strength at room temperature Type of abrasive | | | Plate adhesion strength in heat cycle Type of abrasive | | |
|---|---|---|---|---|---|---|
| | GB | SB | WA | GB | SB | WA |
| Example 1 | x | x | 1.0 | — | — | 0.5 |
| Example 2 | x | x | 1.2 | — | — | 0.8 |
| Example 3 | x | x | 1.3 | — | — | 0.9 |
| Example 4 | x | x | 1.5 | — | — | 1.0 |
| Example 5 | x | x | 1.5 | — | — | 1.0 |
| Example 6 | x | x | 1.5 | — | — | 1.0 |
| Example 7 | x | x | 1.0 | — | — | 0.7 |
| Example 8 | x | x | 1.0 | — | — | 0.5 |
| Example 9 | x | x | 1.5 | — | — | 1.3 |
| Example 10 | x | x | 1.8 | — | — | 1.6 |
| Example 11 | x | x | 1.1 | — | — | 0.8 |
| Comparative Example 1 | x | x | 0.3 | — | — | <0.1 |
| Comparative Example 2 | x | x | <0.1 | — | — | <0.1 |
| Comparative Example 3 | x | x | <0.1 | — | — | <0.1 |
| Comparative Example 4 | x | x | 0.8 | — | — | 0.4 |

In the molded articles obtained by the treatment with blast using the abrasive having the sharp shape in the invention and having the adhesion strength of the plated film which is clearly exhibited depending on the type of the abrasive, the formation of the plated film having the high adhesion strength is observed. Meanwhile, in the molded articles treated with blast using the abrasive beads, the formation of the plated film is not observed. In the molded articles obtained by the treatment with blast using the abrasive having the sharp shape as shown in Comparative Examples 1 to 4, when the amount of the inorganic filler is less than 50% by weight, no satisfactory adhesion strength of the plated film is provided. By the way, as shown in Examples 3 to 7, 9 and 10 in which the whisker is used as the inorganic ller, the adhesion strength of the plated film is especially high. Further, in Example 10, the adhesion strength in the at cycle is especially high due presumably to the effect provided by MgO having the good heat dissipation.

What is claimed is:

1. A process for producing an electrolessly plated molded article, which comprises molding a resin composition made of
   (A) 100 parts by weight of a thermoplastic resin having the following properties (a1) and (a2)
      (a1) an Izod impact strength of 35 J/m or less, and
      (a2) a surface hardness of R115 or more in terms of a Rockwell surface hardness, and
   (B) 100 parts by weight or more of an inorganic filler, then treating the surface of the molded article with blast to make a surface roughness Rmax 15 µm or more, and thereafter conducting catalyst coating, activation treatment and electroless plating.

2. The process for producing an electrolessly plated molded article as claimed in claim 1, wherein the treatment with blast is conducted by treatment with air blast using an abrasive having a granular shape.

3. A process for producing an electrolessly plated molded article, which comprises molding a resin composition made of
   (A) 100 parts by weight of a thermoplastic resin having the following properties (a1) and (a2)
      (a1) an Izod impact strength of 35 J/m or less, and
      (a2) a surface hardness of R115 or more in terms of a Rockwell surface hardness, and
   (B) 100 parts by weight or more of an inorganic filler, then treating the surface of the molded article with air blast using an abrasive having a granular shape, and thereafter conducting catalyst coating, activation treatment and electroless plating.

4. The process for producing an electrolessly plated molded article as claimed in claim 2 or 3, wherein the abrasive having the granular shape is granulated alumina.

5. The process for producing an electrolessly plated molded article as claimed in any one of claims 1 to 3, wherein the thermoplastic resin is a polyarylene sulfide or a syndiotactic polystyrene.

6. The process for producing an electrolessly plated molded article as claimed in any one of claims 1 to 3, wherein at least a part of the inorganic filler is a whisker.

7. The process for producing an electrolessly plated molded article as claimed in claim 6, wherein the whisker is one type or a combination of two or more types selected from the group consisting of a zinc oxide whisker, an aluminum borate whisker and a calcium silicate whisker.

* * * * *